United States Patent
McGoldrick et al.

(10) Patent No.: US 6,226,708 B1
(45) Date of Patent: May 1, 2001

(54) METHOD AND SYSTEM FOR EFFICIENTLY PROGRAMMING NON-VOLATILE MEMORY

(75) Inventors: Robert F. McGoldrick, Sugarland, TX (US); Andrew J. Allan, Wrentham, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/135,960

(22) Filed: Aug. 18, 1998

Related U.S. Application Data

(60) Provisional application No. 60/055,910, filed on Aug. 18, 1997.

(51) Int. Cl.⁷ .................................................. G06F 12/00
(52) U.S. Cl. ........................ 711/103; 711/150; 711/167; 711/168
(58) Field of Search .................................... 711/103, 167, 711/150, 168; 365/185.11, 185.29, 185.33, 194

(56) References Cited

U.S. PATENT DOCUMENTS

| | | | |
|---|---|---|---|
| 5,541,887 | * | 7/1996 | Dhong et al. ............... 365/230.05 |
| 5,649,161 | * | 7/1997 | Andrade et al. ................... 711/167 |
| 5,740,112 | * | 4/1998 | Tanaka et al. .................. 365/189.01 |
| 5,831,929 | * | 11/1998 | Manning ............................. 365/233 |
| 5,949,716 | * | 9/1999 | Wong et al. ................... 365/185.29 |
| 5,983,330 | * | 11/1999 | Miwa et al. ......................... 711/167 |
| 6,026,020 | * | 2/2000 | Matsubara et al. ............ 365/185.11 |

OTHER PUBLICATIONS

Computer System Architecture, Third Edition, pp 42–43, M. Morris Mano, 1993.*

* cited by examiner

*Primary Examiner*—Matthew Kim
*Assistant Examiner*—Christian P. Chace
(74) *Attorney, Agent, or Firm*—Robert D. Marshall, Jr.; W James Brady, III; Frederick J. Telecky, Jr.

(57) ABSTRACT

A method of writing a plurality of data values to a plurality of non-volatile memory modules connected to a processor includes initiating writing of a first data value to a first non-volatile memory array and delaying processing by the processor for a predetermined time to allow the first data value to be written to the first non-volatile memory array. The method further includes initiating writing of a second data value to a second non-volatile memory array before delaying processing by the processor to allow the processor to delay processing while both the first data value and the second data value are being written.

5 Claims, 3 Drawing Sheets

METHOD AND SYSTEM FOR EFFICIENTLY PROGRAMMING NON-VOLATILE MEMORY

This application claims priority under 35 USC §119(e)(1) of Provisional Application Number 60/055,910, filed Aug. 18, 1997.

TECHNICAL FIELD OF THE INVENTION

This invention relates generally to microprocessors and more particularly to a method and system for efficiently programming non-volatile memory in a microprocessor.

BACKGROUND OF THE INVENTION

Non-volatile memory retains information in the absence of power. Examples of non-volatile memory include erasable programmable read-only memory (EPROM) and electrically erasable programmable read-only memory (EEPROM). Non-volatile memory may be used in a variety of electronic devices to provide storage capability, including for example, microprocessors and, more particularly, microcontrollers.

Programming or writing to non-volatile memory is conventionally much slower than reading from non-volatile memory. This contrasts with volatile memory, in which the time required to read and write data are similar. This phenomena may be understood with reference to FIG. 1.

FIG. 1 illustrates one example of a portion of a non-volatile memory, showing a floating-gate field-effect transistor 10 that functions as a memory cell that is part of an EEPROM memory array. In this example, floating-gate field-effect transistor 10 is an n-channel metal oxide semiconductor. Floating-gate field-effect transistor 10 includes a control gate 12, which controls the programming operations of floating-gate field-effect transistor 10, a floating gate 14, which stores an electrical charge, a drain 16, a source 18, and a channel region 15 disposed between source 18 and drain 16.

To program floating-gate field-effect transistor 10, a relatively high voltage is applied to control gate 12 and drain 16 simultaneously. As a result of this excitation, some of the electrons in channel region 15 acquire enough energy to be transported from channel region 15 via a thin oxide layer 20 to floating gate 14, as indicated by arrow 19. This captured negative charge leaves channel 15 more positive and, hence, less conducting. As a result, the threshold voltage at control gate 12 is higher for a charged cell than for one that has no charge on floating gate 14. Consequently, for a given voltage applied to control gate 12, floating-gate field-effect transistor 10 will conduct if floating gate 14 is not charged and remain non-conducting if the floating gate 14 is charged with stored electrons. Therefore, a one or a zero may be stored by floating-gate field effect transistor 10 based on whether or not current flows through the transistor. Discharge of electrons from floating gate 14 is illustrated by arrows 22.

Charging or discharging, and therefore programming or writing to floating gate 14, may be time consuming for several reasons. First, the time required for electrons to move from channel 15 through oxide layer 20, and onto floating gate 14 is significant. In addition, charging floating gate 14 may cause damage to oxide layer 20 between channel 15 and floating gate 14 because of a resulting electric field. Therefore, charging should be performed slowly to protect the integrity of oxide layer 20.

A plurality of non-volatile memory cells may be grouped to form an addressable location within a non-volatile memory array. Addressable locations typically include eight or sixteen bits. A non-volatile memory array may be contained on a non-volatile memory module along with control registers and additional circuitry that controls access to the non-volatile memory array. A plurality of non-volatile memory modules may be contained within one electronic device. In some prior electronic devices, only one address location in each non-volatile memory module may be accessed at a given time. Therefore, because the time required to program the addressable location is substantial, programming all non-volatile memory arrays within an electronic device may be very time consuming. In addition, the use of a plurality of non-volatile memory modules conventionally leads to a large number of peripheral select lines required to access each non-volatile memory module. Requiring a large number of peripheral select lines is undesirable, for example, because it may exhaust the limited number of peripheral select lines that are available and it reduces the efficiency of the code.

SUMMARY OF THE INVENTION

Therefore a need has arisen for a method and system for efficiently programming non-volatile memory that address the disadvantages and deficiencies of prior systems and methods. The invention includes a method and system for efficiently programming non-volatile memory.

A method of writing a plurality of data values to a plurality of non-volatile memory modules connected to a processor includes initiating writing of a first data value to a first non-volatile memory array and delaying processing by the processor for a predetermined time to allow the first data value to be written to the first non-volatile memory array. The method further includes initiating writing of a second data value to a second non-volatile memory array before delaying processing by the processor to allow the processor to delay processing while both the first data value and the second data value are being written.

According to another aspect of the invention, a microprocessor includes a central processing unit and a memory system accessible by the central processing unit. The memory system includes memory divided into a plurality of non-volatile memory modules with each non-volatile memory module including a non-volatile memory array and a control register associated with the non-volatile memory array. The microprocessor also includes a common control register select line connecting the central processing unit to each control register in the plurality of non-volatile memory modules for providing access to the plurality of non-volatile memory arrays by the central processing unit.

The invention provides several technical advantages. For example, according to the invention the amount of time required to write to all cells of a non-volatile memory system is reduced by, at least in part, splitting a non-volatile memory system into a plurality of memory arrays, each memory array stored on a separate module having a separate control register. Because each memory has a separate control register, multiple memory cells may be written to, or programmed, at the same timel In addition, according to the invention, the number of peripheral select lines required for memory modules is reduced by connecting the memory modules to a common control register select bus.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF INVENTION

An embodiment of the present invention and its advantages are best understood by referring to FIGS. 1 through 6 of the drawings, like numerals being used for like and corresponding parts of the various drawings. The invention involves a method and system for efficiently programming, or writing to, non-volatile memory. The invention reduces the amount of time required to write to all addressable locations of a non-volatile memory system by, at least in part, splitting a non-volatile memory system into a plurality of memory arrays, each memory array stored on a separate module having a separate control register. Because each memory has a separate control register, multiple memory cells may be written to, or programmed, at the same time.

Writing in a parallel form to multiple memory cells reduces the number of times a delay loop is implemented. A delay loop is conventionally utilized when writing to non-volatile memory to allow a sufficient time for the non-volatile memory cells to charge or discharge. By reducing the number of times a delay loop is executed, the total amount of time required to program a non-volatile memory system is reduced. Additional advantages may be achieved through providing a common select line to a plurality of memory modules to facilitate writing in parallel to a plurality of memory cells.

Figure 1:
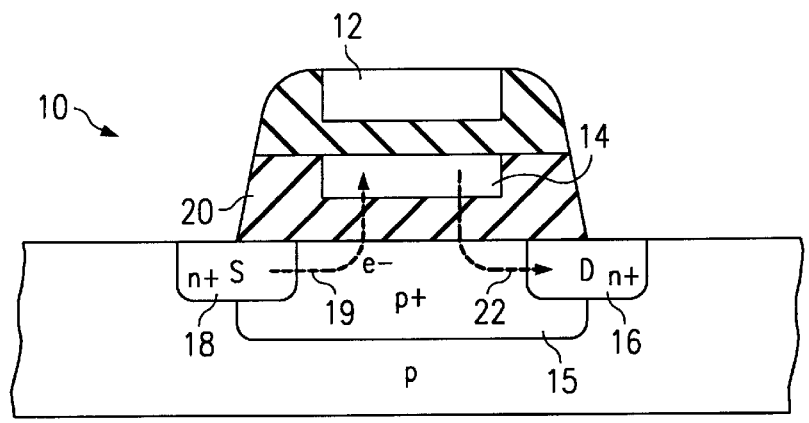
FIG. 1 is a schematic cross-sectional diagram illustrating one example of a non-volatile memory cell.
Figure 2:
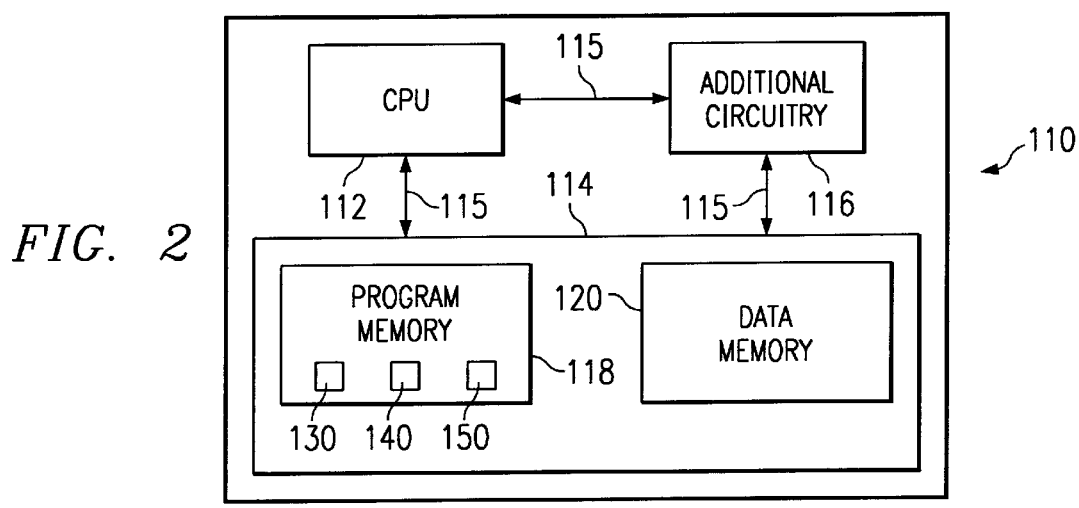
FIG. 2 is a block diagram illustrating one embodiment of a microcontroller according to the teachings of the invention.

FIG. 2 is a block diagram illustrating one embodiment of a microcontroller 110 according to the teachings of the invention. The invention is described in the context of a microcontroller; however, other electronic devices that utilize non-volatile memory may incorporate the teachings of the invention. Microcontroller 110 includes a central processing unit 112 and a memory system 114 accessible by central processing unit 112. Microcontroller 110 may also include additional circuitry 116. Central processing unit 112, memory system 114, and additional circuitry 116 may communicate through a plurality of electrical connections 115. Memory system 114 may include a program memory system 118 and data memory system 120.

In the embodiment illustrated in FIG. 2, program memory system 118 may include erasable programmable read-only memory (EPROM); however other types of non-volatile memory may be used such as, for example, electronically erasable programmable read-only memory. Data memory system 120 may also include various types of non-volatile memory and volatile memory. Program memory system 118 is organized into a plurality of non-volatile memory modules. As illustrated in FIG. 2, program memory system 118 includes memory modules 130, 140, and 150; however, any suitable number of memory modules may be used. As described in greater detail below, organizing program memory system 118 into a plurality of memory modules, rather than merely one memory module, facilitates efficient programming of the non-volatile memory cells contained within program memory system 118. Data memory system 120 may also be similarly organized.

According to the invention and as described in greater detail below, for a given number of non-volatile memory locations in program memory system 118, the time required to write to all non-volatile memory location in program memory system 118 reduces as the number of non-volatile memory modules increases. For example, the time required to write to all non-volatile memory locations in memory modules 130, 140, and 150 could be further reduced if each memory module 130, 140, and 150 was split into two memory modules.

Figure 3:
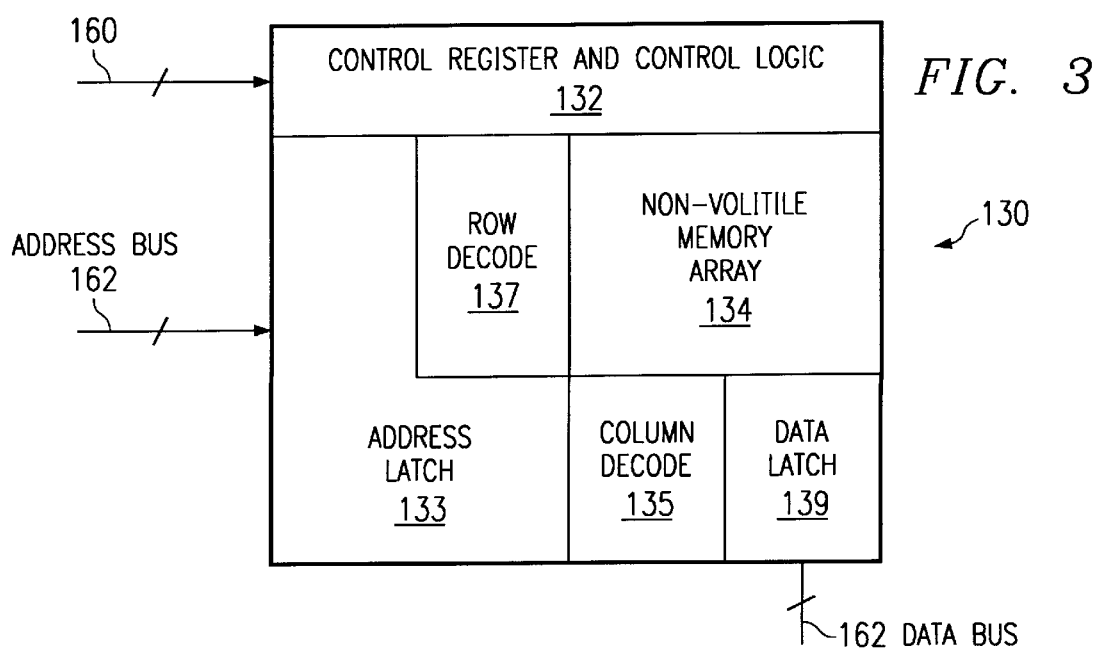
FIG. 3 is a block diagram illustrating a non-volatile memory module contained within the microcontroller illustrated in FIG. 2.

FIG. 3 is a block diagram illustrating non-volatile memory module 130 of FIG. 2. Writing to addressable locations within non-volatile memory module 130 is described with reference to FIG. 3. Non-volatile memory module 130 may include a control register 132 and a non-volatile memory array 134. Non-volatile memory array 134i includes a plurality of addressable locations containing a plurality of non-volatile memory cells for storing information. Control register 132 controls writing or programming access by the remainder of microcontroller 110 to non-volatile memory array 134.

Non-volatile memory module 130 may also include an address latch section 133 and a data latch section 139. Non-volatile memory module 130 may also include a row decode section 137 and a column decode section 135 that are associated with address latch 133. Although memory module 130 is illustrated, any suitable type of non-volatile memory may be incorporated by the teachings of the invention.

Address latch section 133 receives and latches an address value received from a data and address bus 162 and holds the address value during a programming operation. Address latch section 133 transmits the address value to a row decode section 137 and a column decode section 135. Row decode section 137 and column decode section 135 decode the address value and specify the location in non-volatile memory array 134 that an associated data value will be stored. Data latch section 139 latches a data value received from data bus 162 and holds that data value until it is transferred into the location in non-volatile memory array 134 specified by row decode section 137 and column decode section 135. As illustrated in FIG. 3, data bus 162 carries both data and addresses associated with that data; however, separate data and address busses may be incorporated without departing from the scope of the present invention. Non-volatile memory modules 140 and 150 may be substantially similar to non-volatile memory module 130

Thus, in order to write data on data and address bus 162 to addressable locations having a plurality of memory cells within non-volatile memory array 134, the data is first placed into data latch 139 and subsequently transferred from data latch 139 to an appropriate location in non-volatile memory array 134. During transfer from data latch 139 to non-volatile memory array 134, processing of central processing unit 112 is delayed to allow sufficient time for a floating gate, such as floating gate 114 to charge or discharge. By contrast, placing data into data latch 139 requires only one clock cycle of microcontroller 110. Thus, writing to non-volatile memory is conventionally time-consuming, particularly because conventionally only one addressable location within a non-volatile memory module may be written to at a time.

Figure 4:
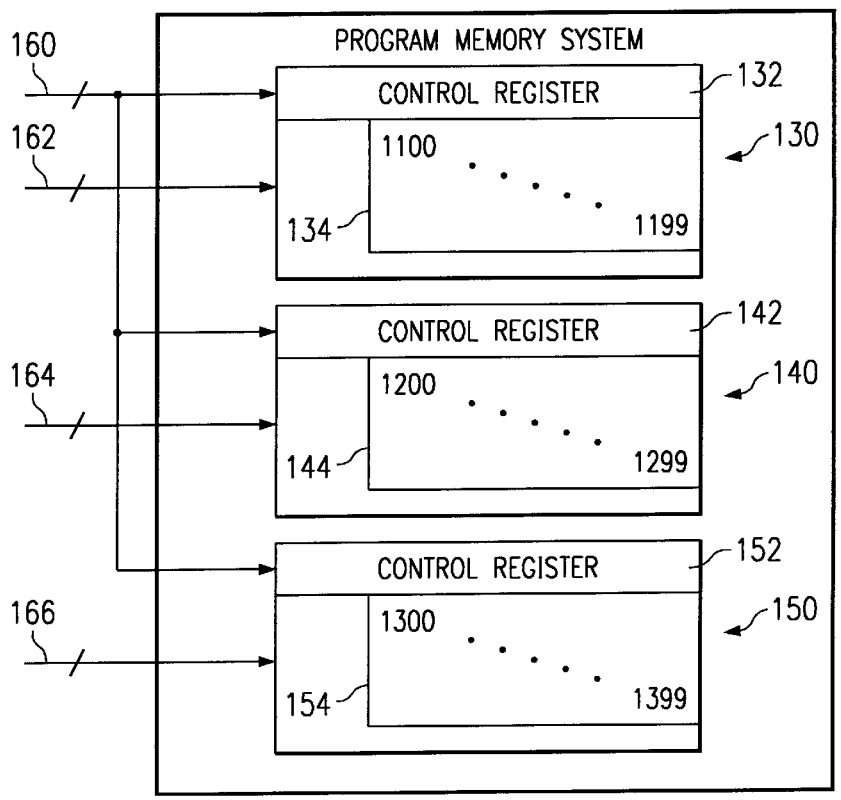
FIG. 4 is a block diagram illustrating an example architecture for a program memory system of the microcontroller illustrated in FIG. 2, according to the teachings of the invention, showing a plurality of memory modules having a common control register select bus.
Figure 5:
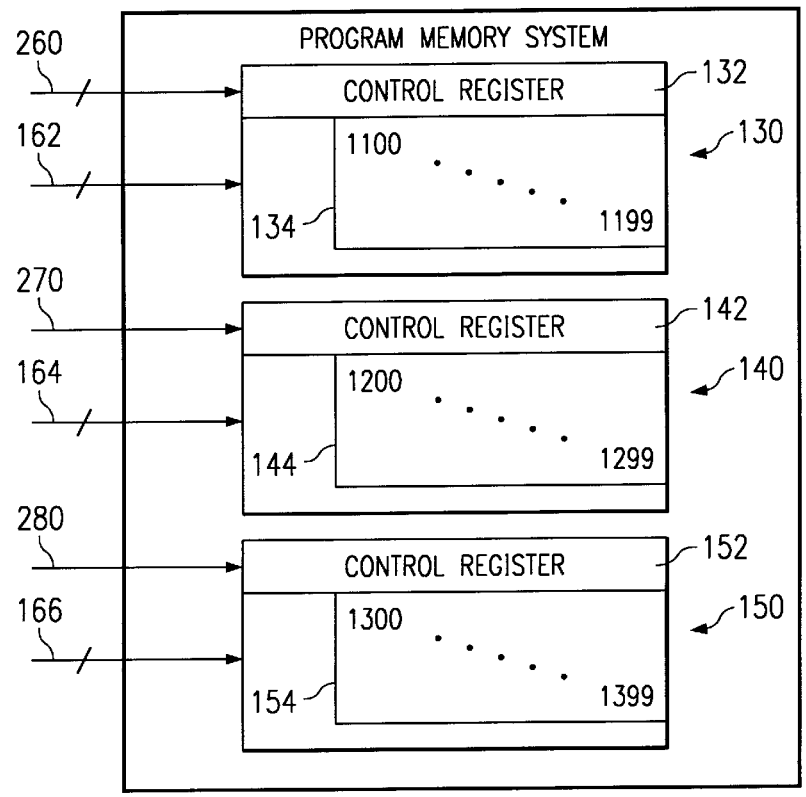
FIG. 5 is a block diagram illustrating another example architecture for a program memory system of the microcontroller illustrated in FIG. 2 according to the teachings of the invention, showing a plurality of memory modules having separate control register select buses.

FIG. 4 is a block diagram illustrating an example architecture for a program memory system 118 of the microcontroller of FIG. 2 according to the teachings of the invention, showing a plurality of memory modules having a common control register select bus 160. FIG. 5 is a block diagram illustrating another example architecture for program memory system 118 according to the teachings of the invention, showing a plurality of memory modules having separate control register select buses 260, 270, and 280. Writing to non-volatile memory cells within non-volatile memory modules 130, 140, and 150 is described with reference to FIGS. 4 and 5.

As shown in FIG. 4, program memory system 118 includes a plurality of non-volatile memory modules 130, 140, and 150, with each non-volatile memory module having a control register 132, 142, and 152 and an associated non-volatile memory array 134, 144, and 154 to facilitate efficient programming. As shown, non-volatile memory array 134 contains non-volatile memory cells having addresses of 1100 through 1199; non-volatile memory array 1144 contains non-volatile memory cells having addresses 1200 through 1229; and non-volatile memory array 154 containing non-volatile memory cells having addresses 1300 through 1399.

In one embodiment of the invention, each control register 132, 142, and 152 is accessed through a common central register select bus 160 while each non-volatile memory array 134, 144, and 154 is accessed through separate data buses 162, 164, and 166. In another embodiment, illustrated in FIG. 5, each control register 132, 142, and 152 is accessed through separate select buses 260, 270, and 280. In both embodiments, data may be written from data buses 162, 164, and 166 to addressable locations having a plurality of the non-volatile memory cells within program memory system 118 in an efficient manner by moving data from a data latch in each memory module to an addressable location having a plurality of non-volatile memory cells in each non-volatile memory array at the same time.

In this manner, the delay associated with waiting for the floating gate of a non-voltage memory cell at each addressable location to charge or discharge may occur in parallel. Therefore, the efficiency gains derived through moving data from a data latch to a non-volatile memory cell in a parallel fashion for all memory modules may be proportional to the number of modules used in a memory system. The efficiency gains that may be available over conventional methods and systems is explained in greater detail in conjunction with FIG. 6.

Figure 6:
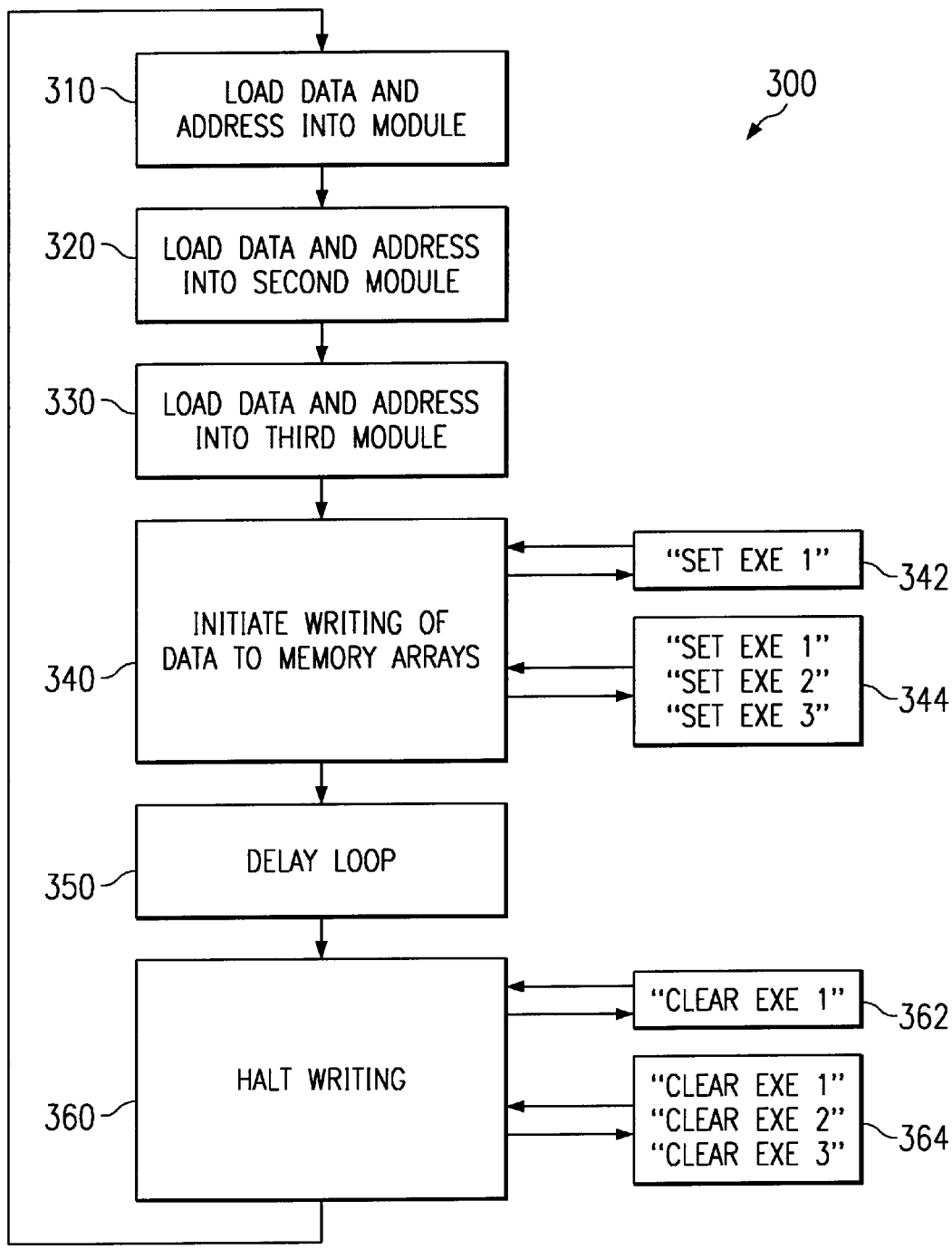
FIG. 6 is a flow chart illustrating a process for programming a plurality of non-volatile memory arrays according to the teachings of the invention.

FIG. 6 is a flow chart illustrating a process 300 for programming, or writing to, a plurality of addressable locations having a plurality of non-volatile memory cells according to the teachings of the invention. Process 300 of programming a plurality of addressable locations having a plurality of non-volatile memory cells includes a step 310 of loading data and an address associated with the data into a first non-volatile memory module, such as non-volatile memory module 130. This step 310 of loading may include storing the data and the address associated with the data in two suitable latches, such as address latch 137 and data latch 139, respectively, for sulsequent transfer of the data to a memory location specified by the address within a non-volatile memory array. This step 310 of loading data and an address into appropriate latches may be performed, for example, by executing a command in the form "move 1234 1120," where "1234" is the data value being stored within a memory module and "1120" is the address of the location in memory module in which the data value "1234" will be stored. Other suitable methods for implementing step 310 may also be used.

Process 300 of programming, or writing to, a plurality of addressable locations having a plurality of non-volatile memory cells may also include a step 320 of loading data and an address associated with the data into a second none volatile memory module, such as non-volatile memory module 140. This step is analogous to step 310. Process 300 may also include a step 330 of loading data and an address associated with the data into a third non-volatile memory module, such as non-volatile memory module 150. Step 130 is analogous to steps 110 and 120.

According to the invention, steps 310, 320, and 330 of loading a data value and an address associated with the data value occur in series, but occur before any data is transferred from a latch within memory modules 130, 140, and 150 to a memory location within memory module arrays 134, 144, and 154. Each step of loading requires only a few clock cycles of processing time by the central processing unit.

Process 300 of programming, or writing to non-volatile memory cells, continues with a step 340 of initiating writing of a data value stored within a latch, such as data latch 139, within a first memory module 130 to a memory location within the first memory module 130. Step 340 may be performed, for example, by a step 342 of executing a command in the form "set EXE 1," where "set EXE" initiates transfer of a data value contained within a latch in a memory module, and "1" identifies the memory module.

According to the invention, if a common select bus 160 is connected to each memory module 130, 140, and 150, memory modules 130, 140, and 150 would be identified by the same module address. Thus, in the above example, memory modules 130, 140, and 150 would each have a module address of "1." Therefore initiating writing of a data value from a latch to a memory location for one memory module initiates writing a data value from a latch to a memory location in each memory module. Connecting memory modules 130, 140, and 150 to a common control register select bus allows initiation of transfer of data from a latch in each memory module 130, 140, and 150 with a single command. This creates additional time savings, particularly if programming 118 is organized into a large number of memory modules. In addition, the number of peripheral select lines required for all modules in a microcontroller 110 may be reduced because each memory module 130, 140, and 150 possesses the same address. This is advantageous because, for example, the number of peripheral select lines in a microcontroller may be limited because it increases the efficiency of the code.

Alternatively, if each memory module has a separate select line, 260, 270, and 280, as illustrated in FIG. 5, initiating writing of a data value from a latch in a first module to a memory location within an associated memory array would only initiate such writing for that one memory module. Thus, if writing of data is desired for all modules having separate select lines, an alternative step 344 of executing three separate commands such as "set EXE 1," "set EXE 2," and "set EXE 3" could be used.

After initiating transfer of data from latches within modules 130, 140, and 150, a delay step 350 is utilized. Delay step 150 delays processing by central processing unit 112 until enough time has passed for the data values stored in the latches in the memory modules to be written to the non-volatile memory arrays. As discussed previously, writing to non-volatile memory is relatively slow due to the time required to charge a floating gate in a transistor utilized in a non-volatile memory cell in an addressable memory location. By initiating transfer of data within a data latch of each memory module before delaying processing by control processing unit 112, the amount of time to program all non-volatile memory cells within program memory system 118 is less than that required if the control processing unit was required to delay processing while the memory cells at only one addressable location were charging or discharging.

After delay step 350 is complete, a step 360 of halting writing of data is executed. Such halting of writing of data may be performed, for example, through step 362 of executing a command such as "clear EXE 1." If common control register select line 160 is used for memory modules 130, 140, and 150, one command may halt writing of data. If separate select lines 260, 270, and 280 are employed, three commands, such as "clear EXE 1," "clear EXE 2," and "clear EXE 3" would be used at step 364. Halting the programming sequence prepares a memory module to receive new data in its associated latches for subsequent transfer to memory locations within a non-volatile memory array. After halting the programming sequence, steps 310 through 360 may be repeated until data has been written to all desired memory locations.

Thus, according to the invention, initiating programming of all modules before delaying processing by central processing unit 112 results in significant reduction in programming time because the delay associated with charging or discharging the floating gate in an addressable location of a non-volatile memory module may occur at the same time as the delay associated with charging or discharging the floating gates in other memory modules, rather than programming each memory module -in series.

Although the invention has been particularly shown and described by the foregoing detailed description, it will be understood by those skilled in the art that various changes in form and detail may be made without departing from the spirit and scope of the invention.

What is claimed is:

1. A method of writing a plurality of data values to selected addressable locations in a plurality of non-volatile memory modules connected to a processor, the method comprising the steps of:

storing a first data value in a first data latch of a first memory module of the plurality of non-volatile memory modules and an associated first address in a first address latch of the first memory module;

storing a second data value in a second data latch of a second memory module of the plurality of non-volatile memory modules and an associated second address in a second control register of the second memory module;

simultaneously writing the first data value from the first data latch to a first non-volatile memory array of the first memory module at the first address stored in the first address latch and writing the second data value from the second data latch to a second non-volatile memory array of the second memory at the second address stored in the second address latch; and delaying processing by the processor for a predetermined time to allow the first data value to be written to the first non-volatile memory array and the second data value to be written into the second non-volatile memory array.

2. A method of programming non-volatile memory in a plurality of non-volatile memory modules stored in a microprocessor having a central processing unit, the method comprising the steps of:

storing a data value in a data latch of each memory module of the plurality of memory modules and an associated address in an address latch of each memory module of the plurality of non-volatile memory modules;

simultaneously writing the data value from each data latch into a corresponding non-volatile memory array of each memory module at the associated address stored in the corresponding address latch; and delaying processing by the processor after initiating writing to each of the plurality of non-volatile memory arrays to allow sufficient time for the respective data values to be written.

3. The method of claim 2 wherein the step of simultaneously writing the data values comprises providing a command to a control register of each memory module through a common control register select line.

4. A microprocessor comprising:

a central processing unit;

a memory system accessible by the central processing unit, the memory system comprising memory divided into a plurality of non-volatile memory modules, each non-volatile memory module comprising a data latch, an address latch, a non-volatile memory array and a control register; and a common control register select line connecting the central processing unit to each control register in the plurality of non-volatile memory modules, a predetermined signal generated by said central processing unit on said common control register select line causing each of said memory modules to simultaneously store data stored in said corresponding data latch in said non-volatile memory array at said associated address stored in said corresponding address latch.

5. The method of claim 2 wherein the step of simultaneously writing the data values comprises providing a command to the control register of each memory module through a plurality of control register select lines, one control register select line connected to each memory module.

* * * * *